United States Patent
Ewers et al.

(10) Patent No.: US 6,932,637 B2
(45) Date of Patent: Aug. 23, 2005

(54) COMPONENT CARRIER

(75) Inventors: Paul Simon Ewers, Chelmsford (GB); Rapinder Mangat, Dartford (GB); Pascal Guirauton, Montiny les Cormelles (FR)

(73) Assignee: Visteon Global Technologies, Inc., Van Buren Township ( * ) Notice: Subject to any disclaimer, the term of this patent is extended or adjusted under 35 U.S.C. 154(b) by 318 days.

(21) Appl. No.: 10/087,276

(22) Filed: Mar. 1, 2002

(65) Prior Publication Data

US 2002/0146928 A1 Oct. 10, 2002

(30) Foreign Application Priority Data

Mar. 3, 2001 (GB) .............................................. 0105343

(51) Int. Cl.⁷ .............................................. H01R 13/64
(52) U.S. Cl. ........................ 439/248; 439/247; 439/374
(58) Field of Search ............................ 439/381, 67–71, 439/246–248, 374, 892

(56) References Cited

U.S. PATENT DOCUMENTS

| | | | | |
|---|---|---|---|---|
| 3,651,444 A | * | 3/1972 | Desso et al. ................ | 439/141 |
| 4,227,765 A | * | 10/1980 | Neumann et al. ........... | 439/248 |
| 4,954,094 A | * | 9/1990 | Humphrey ................... | 439/247 |
| 4,959,609 A | * | 9/1990 | Prokopp et al. ............ | 324/537 |
| 5,437,558 A | * | 8/1995 | Sakuraoka et al. ......... | 439/140 |
| 5,556,286 A | * | 9/1996 | Ikesugi et al. ................ | 439/74 |
| 5,876,228 A | * | 3/1999 | Hayashi ...................... | 439/248 |
| 6,224,407 B1 | * | 5/2001 | Duquerroy et al. ......... | 439/188 |
| 6,390,841 B1 | * | 5/2002 | Zaguskin ..................... | 439/248 |
| 6,592,387 B2 | * | 7/2003 | Komenda et al. ........... | 439/247 |

FOREIGN PATENT DOCUMENTS

GB 2107517 A 4/1983

* cited by examiner

*Primary Examiner*—Michael C. Zarroli
(74) *Attorney, Agent, or Firm*—Brinks Hofer Gilson & Lione

(57) ABSTRACT

This invention relates to a carrier for holding an electric component (4) having a one or more electrical connection pins (6), comprising a frame (2) for holding the component, a pin guide (8), and a flexible portion (10) connecting the pin guide to the frame. The pin guide having one or more channels through it for receiving the electrical connection pins (6). The frame having a base for mounting the carrier to a surface and the flexible portion being adapted to flex to allow the pin guide to move parallel to the connection axis (16) when the pin guide is pressed in a direction along the connection axis.

10 Claims, 3 Drawing Sheets

COMPONENT CARRIER

BACKGROUND

1. Field of the Invention

The present invention relates to a carrier for an electronic component, and to use of the carrier to mount an electrical component having one or more connection pins to a circuit board.

2. Related Art

During manufacture of an electrical assembly comprising a circuit board with one or more electronic sub-assemblies mounted on the circuit board, it is often necessary for electrical connections from the sub-assemblies to be inserted into through-plated holes or connector sockets on the board. To improve assembly efficiency, it is common practice to provide a funnel shaped entry or "lead in" to the sockets. This allows for a certain amount of error in the component alignment during assembly. This solution is effective in many cases, but may not always be sufficient to meet assembly requirements.

A particular problem arises in the production of automotive display units. These units often include a multitude of components such as a speedometer, engine condition gauges, warning lights and information displays. Warning light and display components may be held by a moulded carrier affixed to a circuit board. Back-lighting may then be provided behind the carrier to illuminate a display or symbols printed on the carrier. With such display units, a liquid crystal display or light emitting diode may be offset from the circuit board by a distance, for example by mountings on the carrier. Electrical connection pins then need to span to offset between the electronic components and the circuit board. It is then often necessary to insert long flexible connection pins into through-plated holes or a socket in the board.

It is difficult to automate such an assembly process because of the fragile nature of the pins, and the close tolerances needed to correctly insert a pin into a matching hole or socket, particularly when there are short production times. Manual assembly is relatively expensive and prone to errors. A pin may be bent or mis-inserted, leading to a faulty electronic assembly. Damaged sub-assemblies including a number of electrical components may be relatively expensive to re-work or to discard, leading to a certain wastage of components when parts become bent or broken during assembly.

If electrical connection pins are particularly long or flexible, it may be impractical to insert these into a matching socket, because of the tight fit required to make a good electrical connection. Long pins may be prone to bend upon insertion into a socket. Therefore, in some cases it is not possible to use a connecting socket, and the connection has to be made by soldering pins to the circuit board. It is generally desirable to use single-sided circuit boards, and surface-mounting techniques, to reduce cost. However, moulded carriers and sensitive electronic elements such as liquid crystal displays can be damaged by heat from soldering, which necessitates that soldered connections are made on the side of the circuit board opposite the carrier or component. Since electrical connections may be required on the side of the board towards the carrier or display, for example for a surface mounted speedometer unit, this means that a double-sided board has to be used, thereby increasing cost.

SUMMARY OF THE INVENTION

It is an object of the present invention to address the problems cited above, and provide a carrier for holding an electric component which addresses these issues.

According to the invention there is provided a carrier for holding an electric component having one or more electrical connection pins, comprising a frame for holding the component, a pin guide, and a flexible portion connecting the pin guide to the frame, wherein:

a) the pin guide has one or more channels therethrough for receiving said electrical connection pins, the or each channel extending along a connection axis;

b) the frame has a base for mounting the carrier to a surface that extends transverse to the connection axis; and c) the flexible portion is adapted to flex to allow the pin guide to move parallel to the connection axis when the pin guide is pressed in a direction along the connection axis.

It should be understood that a connection pin may be of a variety of cross sections, for example, circular, square or rectangular.

The provision of a pin guide attached to the carrier may advantageously aid the location of the connection pin into a corresponding socket.

Preferably each connection pin extends into a corresponding channel in the pin guide. This helps each connection pin to be guided by the pin guide and therefore allows for easier location of a number pins at the same time.

Preferably each channel has an entrance into which an end of the corresponding pin is inserted when the electronic component is assembled to the carrier, and an exit from which the pin protrudes when the pin guide moves along the connection axis. The end of the pin is then protected within the channel when the electronic component is initially assembled to the carrier, and protrudes from the channel when the pin guide is moved along the connection axis.

This means that the pin is protected from accidental damage once assembled to the carrier. This will result in fewer connection pins being bent or broken prior to the assembly of the carrier and the circuit board. The fact that the pin protrudes from the end of the pin guide when the pin guide is moved along the connection axis enables the connection pins to be inserted into corresponding sockets on the circuit board.

The pin guide may have one or more protrusions that extend beyond the channel exit(s) in the direction of the connection axis. These protrusions can be used to aid in the accurate location of the pin guide with the respective socket on the circuit board.

Preferably the entrance to the channel is funnel-shaped to aid insertion of the corresponding pin. This means that the pin need only be aligned roughly with the pin guide prior to insertion of the pin into the channel. The funnel-shaped entrance into the channel will guide the pin into the respective channel.

Preferably the or each channel exit has a clearance fit with the corresponding pin to align the pin in orthogonal transverse directions to the connection axis when said pin protrudes from the exit. Therefore, the position of the pin with respect to the pin guide is accurately known when it protrudes from the pin guide. This will enable accurate alignment of the pins with the respective sockets on the circuit board.

Preferably the flexible portion is resiliently biased to a neutral position, and the end of the pin is fully retained in the channel when the flexible portion is in the neutral position. The pin guide then protects the pin prior to assembly of the carrier to the circuit board.

The flexible portion of the carrier may comprise a pair of arms that extend generally transverse to the connection axis in opposite directions from the frame towards the pin guide. Such a symmetric construction of the flexible portion is useful as it constrains the pin guide to move along the connection axis without significant twisting or movement along other dimensions. This provides ease of manufacture for the component carrier. It is still possible, however, to provide sufficient compliance in the flexible portion to allow the pin guide to move slightly in other directions, which may be desirable to permit the pin guide to align with a matching connector.

The electronic component may be a planar display element, such as a liquid crystal display, with one or more connection pins extending from the element in a direction transverse to the plane of the element. The carrier is particularly useful in protecting such long pins and guiding them into a matching socket.

According to another aspect of the invention, there is provided a circuit board assembly, comprising an electronic assembly and a circuit board, the electronic assembly being mounted to the circuit board, and the electronic assembly being as described above, wherein the or each connection pin is electronically connected to a matching connection on the circuit board.

The circuit board assembly may include a socket, the socket being mounted on the circuit board and having one or more pin receptacles. The shape of the pin guide then matches the shape of the socket so that the or each pin is automatically aligned with a corresponding pin receptacle as the electronic assembly is mounted to the circuit board. A benefit of this is that the electronic assembly may be mounted more easily as there is no need to align accurately the pins with the socket prior to assembly. Since this alignment occurs automatically, there is less chance of error and hence it is less likely that a component will be damaged during assembly.

The socket may protrude from the circuit board, and the pin guide may have a recess that matches the protrusion of the socket. This allows for easy automatic alignment of the pin guide with the socket.

The carrier and circuit board may have an alignment means by which the carrier is brought into approximate alignment with the circuit board as the electronic assembly is mounted to the circuit board. This promotes easier assembly of the electronic assembly and the circuit board, since only the carrier and board need to be brought into approximate alignment prior to assembly.

During mounting of the electronic assembly to the circuit board, the approximate alignment may be made before the pin guide comes into contact with the socket. This allows the pin guide to be approximately aligned with the socket automatically prior to the final accurate alignment of the pins with respective sockets.

BRIEF DESCRIPTION OF THE DRAWINGS

The invention will now be further described, by way of example only, with reference to the accompanying drawings, in which.

DETAILED DESCRIPTION

Figure 1:
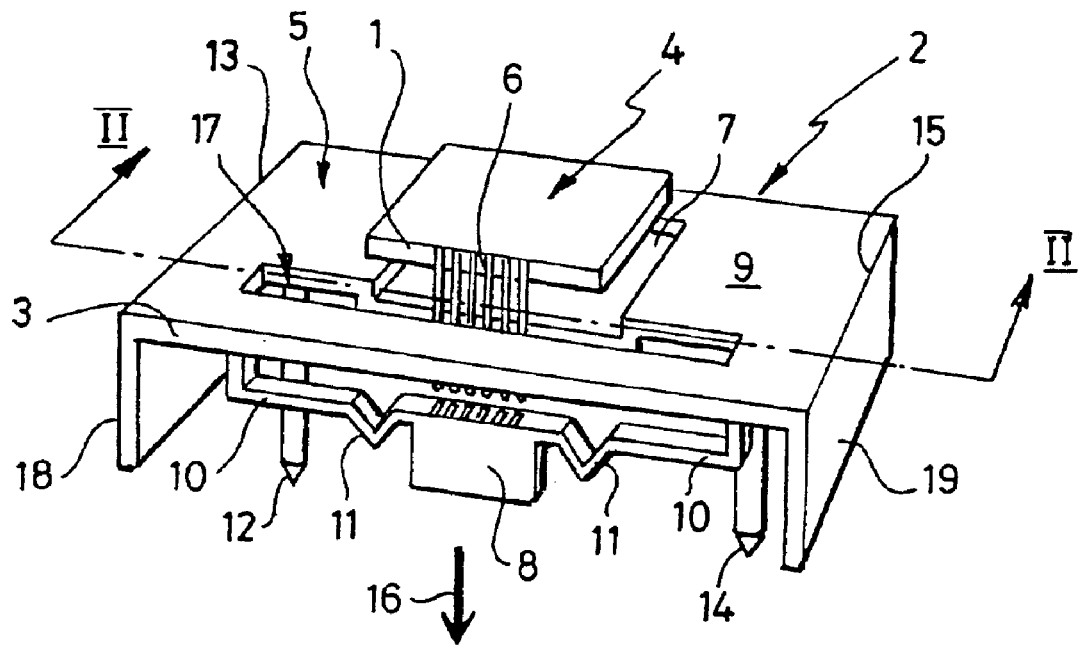
FIG. 1 is a schematic perspective representation of an electronic component being inserted into a carrier according to the invention, the carrier having a flexible portion and a pin guide.

FIG. 1 shows a carrier 2 and an electronic component 4 in the process of being assembled to the carrier. In this example, the component 4 is a liquid crystal display (LCD) 85 mm long, 40 mm wide and 2 mm thick. The LCD 4 is generally planar in shape and has a number of long, flexible, straight connection pins 6 that extend from near the center of a straight front edge 1 of the LCD 4 in a direction perpendicular to the plane of the LCD. The carrier 2 has a generally planar top portion 5 with an upwardly facing surface 9 in which there is a centrally located recess 7 for receiving the LCD 4 in a snap-fit engagement. When LCD 4 is in engagement with the carrier 2, the LCD is flush with the planar top portion 5. Optionally the recess may include a back light (not shown) for illuminating the LCD 4.

A pair of skirts 18, 19 project downwards perpendicularly to the plane of the LCD 4 from two opposite side edges 13, 15 of the planar top portion 5. A rectangular hole 17 is provided through the planar top portion 5 near and parallel to the front edge 3 of the planar top portion 5 to permit the LCD connection pins 6 to extend beneath the level of the upwardly facing surface when the LCD is engaged with the carrier 2. This movement is in the same direction as the length of the pins 6, and defines a connection axis 16. It should be understood that references to front and back refer only to the orientation of the carrier as shown in the drawings.

A substantially rectangular pin guide 8 is suspended from the planar top portion 5 below the hole 17 and located centrally between the skirts 18,19 by a pair of intervening flexible portions 10. The flexible portions 10 extend from either side of the pin guide 8 in directions parallel to the front edge 3 of the planar top portion 5 and are attached near the front edge 3 at points on either side of the hole 17. The flexible portions 10 each have a zigzag bend 11 either side of the pin guide 8 to aid flexing along the connection axis 16. The carrier 2 also has two spike-shaped locator devices 12,14 extending downwardly from the planar top portion 5 in a direction parallel to the connection axis 16. These locator devices 12,14 are positioned behind the flexible portions 10 and extend beyond the skirts 18,19.

Figure 2:
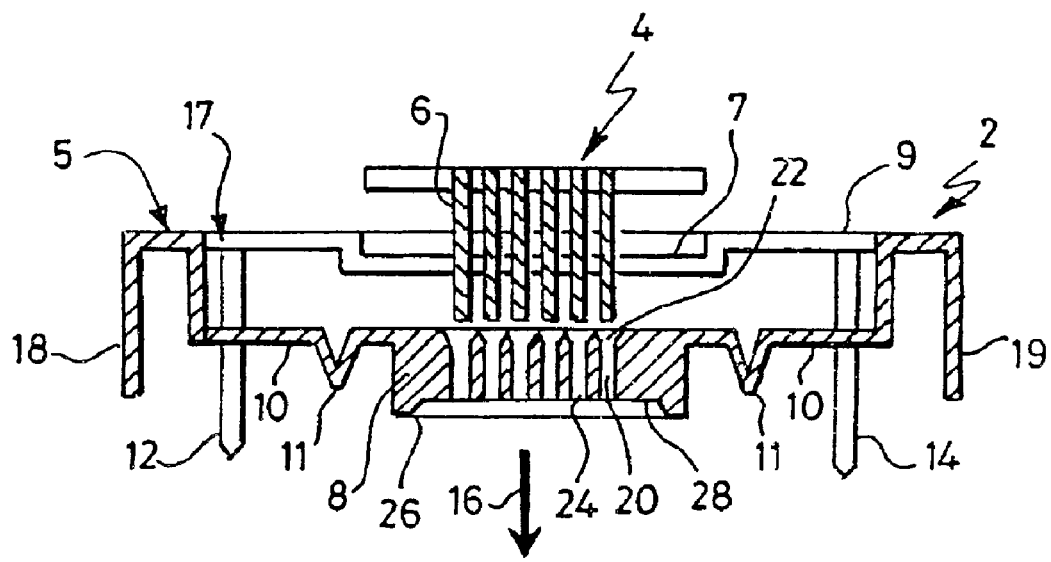
FIG. 2 shows a schematic cross section view through the carrier and component taken along the line II—II of FIG. 1, showing how pins on the electronic component align with channels through the pin guide when the component is inserted into the carrier.

FIG. 2 shows a schematic cross section view through the carrier 2 and the LCD 4 taken along the line II—II of FIG. 1. The drawing shows the general shape of a number of channels 20 through the pin guide 8 and how each one of the pins 6 lines up with a corresponding one of the channels 20 when the LCD 4 is about to be assembled to the carrier along the connection axis. Each channel 20 has a funnel-shaped entrance 22 that is wider than the pin 6 to facilitate entry of the pin 6 into the channel 20. The recess 7 provides an easy way to approximately align the LCD 4 with the carrier 2 prior to assembly and thus allow the pins 6 to be aligned approximately with the channel entrances 22 prior to assembly.

Figure 3:
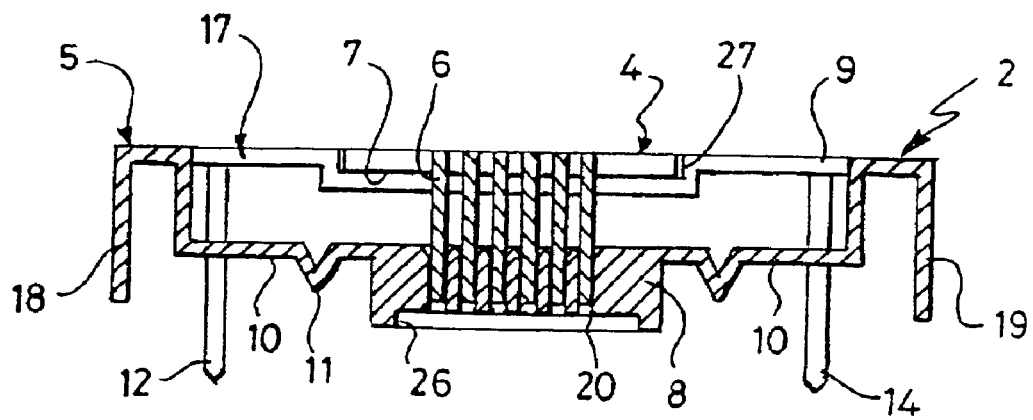
FIGS. 3, 4, 5 and 6 show views similar to that of FIG. 2 of, respectively, the assembly of the component to the carrier, the initial approximate alignment of the carrier with a circuit board, the location of the pin guide with a socket on the circuit board, and the location of the pins in respective sockets.

Each channel 20 narrows towards an exit 24 of the channel 20, the exit 24 being a clearance fit with the pin 6 such that each pin 6 is accurately positioned with respect to the pin guide 8 as each pin 6 approaches the corresponding pin guide exit 24, as shown in FIG. 3.

In the present example, the pin guide 8 is rectangular in a cross-section parallel with the planar top portion 5, and has a similarly rectangular base 28 extending around the pin exits 24. The pin guide base 28 is surrounded on its four sides by a downwardly protruding rim 26. The rim extends in the direction of the connection axis 16. This protrusion 26 is shaped to provide a wide opening which narrows upwardly towards the pin guide base 28 to facilitate the location and engagement of the pin guide 8 with a matching receiving socket 42 as shown in FIGS. 4, 5 and 6.

FIG. 3 shows a cross section view similar to FIG. 2, showing the LCD 4 assembled to the carrier 2, with the LCD 4 fully seated into the recess 17 in the planar top portion 5. This prevents movement of the component 4 relative to the carrier 2 and thus prevents damage to the pins 6, which are located within their respective channels 20.

Figure 4:
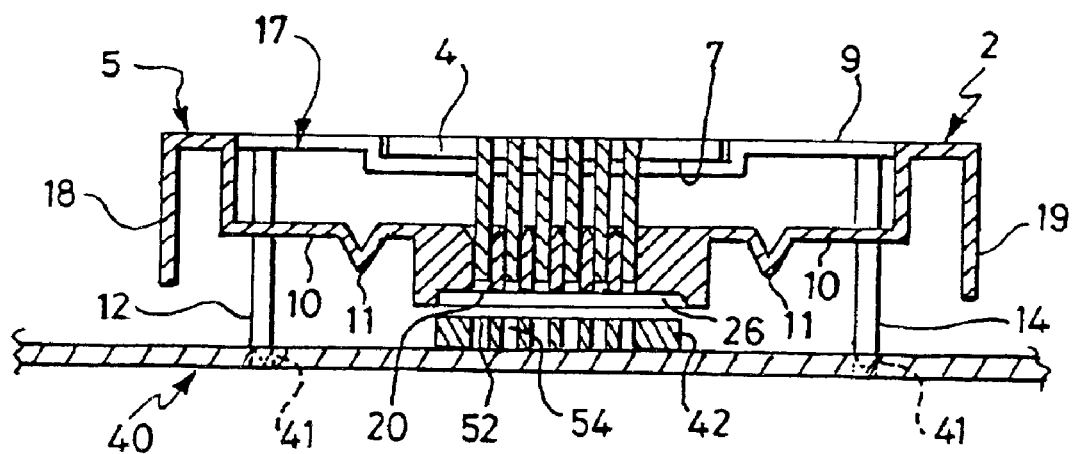

FIG. 4 shows the assembly of carrier 2 and LCD 4 onto a circuit board 40 with the socket 42 mounted on the circuit board. The circuit board 40 is located below the carrier 2 and parallel to the plane of the LCD 4 and the planar top portion 5. The approximate location of the carrier 2 and the circuit board 40 is achieved by moving the carrier 2 and the circuit board 40 together along the connection axis 16. The spike-shaped locator devices 12,14 make contact first with the circuit board 40, and locate into respective matching holes 41 in the circuit board 40. The spiked shape of the locator devices 12,14 allows for some error in the alignment of the carrier 2 with the board 40 prior to full assembly. Once the approximate alignment of the carrier 2 with the board 40 has been made by using the locator devices 12,14 it can be seen that the pin guide 8 has been approximately aligned with the socket 42.

Figure 5:
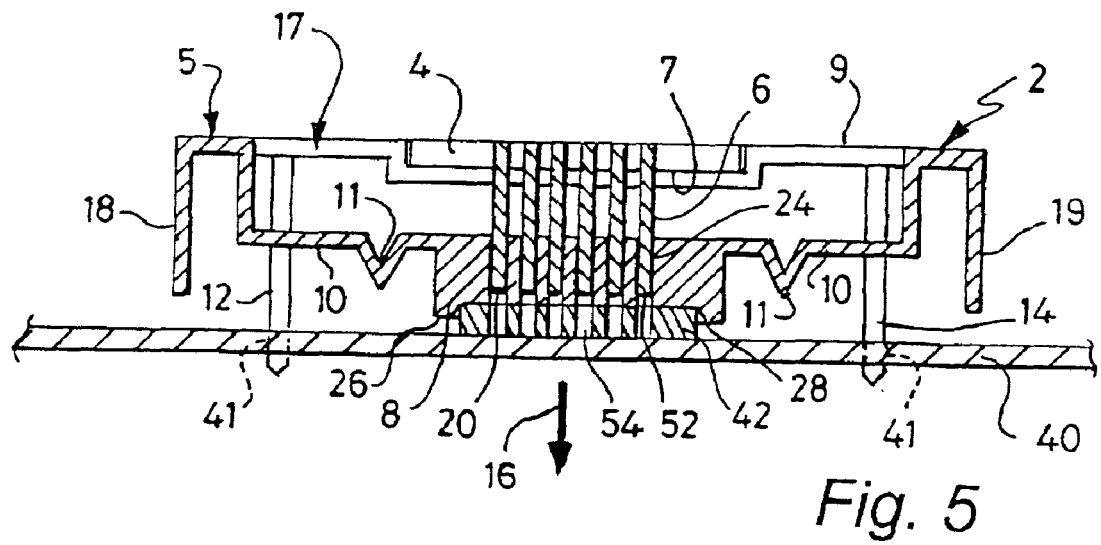
Figure 6:
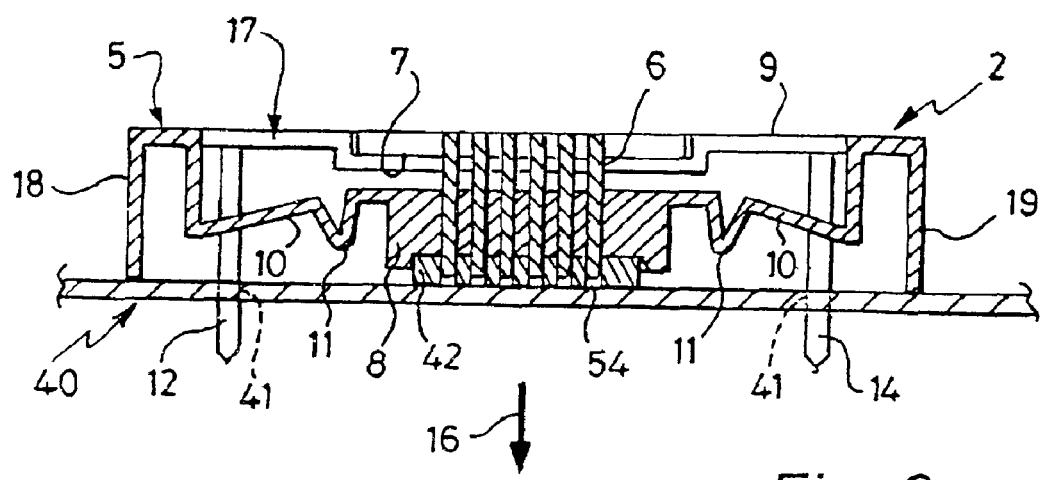

FIG. 5 shows a further stage in the assembly of carrier 2 and LCD 4 to the circuit board 40. The accurate location of the pin guide 8 over the socket 42 has been achieved by the funnel-shaped protruding rim 26 on the pin guide locating the pin guide 8 over the socket 42 correctly. This alignment may include deflection of the flexible portions 10 to allow the pin guide 8 to move in directions transverse to the connection axis 16 so that the pin guide 8 may seat accurately over the socket 42. As a result of the accurate location the pin exits 24 from the channels 20 align with the corresponding entrances 52 and connection holes 54 in the socket 42.

FIG. 6 shows the pins 6 fully inserted into the respective holes 54 in the socket 42. This has been achieved by the deflection of the flexible portion 10 of the component carrier 2 to allow the pin guide 8 to move in a direction along the connection axis 16 towards the planar top portion 5. This deflection is caused by a force applied to the pin guide 8 by the socket 42 in the direction of the connection axis 16. The skirts 18,19 come into contact with the circuit board 40 and support the carrier 2 at a distance from the circuit board 40. This distance being sufficient to allow the pins 6 to enter the connection holes 54, but not be forced onto the circuit board 40 causing possible bending or damage. The distance is also sufficient to permit a conventional LCD backlight (not shown) to be provided on the board 40 or the carrier 2.

Optionally barbs may be provided on the skirts 18,19, locator pins 12,14 or other parts, to effect a "snap-fit" to the circuit board. This allows the carrier 2 and LCD 4 to be held to the board securely. The "snap-fit" preferably also allows the carrier to be removed easily from the circuit board and replaced with another if it is, for instance, found to be faulty. This will reduce the need to scrap a circuit board with many components already attached simply because one component is found to be faulty.

Although the invention has been described with specific reference to a liquid crystal display for an automobile dashboard display, the invention is equally applicable for use in mobile phones, pocket calculators, personal organizers, remote controls for audio-visual equipment or any other apparatus requiring an electrical connection pin to be fitted into a corresponding socket.

It is to be recognized that various alterations, modifications, and/or additions may be introduced into the constructions and arrangements of parts described above without departing from the spirit or scope of the present invention, as defined by the appended claims.

What is claimed is:

1. An electronic assembly, comprising a carrier and an electronic module, the electronic module having one or more electrical connection pins and being mounted to the carrier, the carrier having a frame, a base, and a pin guide attached to the frame by flexible members, wherein:
   a) one or more channels are defined through the pin guide perpendicular to a lower surface thereof and along a connection axis, the one or more channels having an entrance and an exit and said electrical connection pins being received therein;
   b) the base defines a plane for mounting the carrier to a surface that extends transverse to the connection axis;
   c) the flexible members hold the pin guide in a neutral position, and allow the pin guide to move parallel to the connection axis when the pin guide is pressed in a direction along the connection axis, independently of the electrical connection pins; and
   d) the electronic module being mounted to the carrier such that when the pin guide is in a neutral position the electrical connection pins extend into the entrance of the one or more channels, without protruding past the exit, thereby protecting the end of the pins fully within the channel when the electronic component is initially assembled to the carrier, but allowing the pins to protrude from the channel when the pin guide is moved along the connection axis.

2. An electronic assembly as claimed in claim 1, in which the pin guide has one or more protrusions that extend beyond the channel exist(s) in the direction of the connection axis.

3. An electronic assembly as claimed in claim 1, in which the entrance to the channel is funnel-shaped to aid insertion of the corresponding pin.

4. An electronic assembly as claimed in claim 1, in which the or each channel exit has a clearance fit with the corresponding pin to align the pin in orthogonal transverse directions to the connection axis when said pin protrudes from the exit.

5. An electronic assembly, comprising a carrier and an electronic module, the electronic module having one or more electrical connection pins and being mounted to the carrier, the carrier having a frame, a base, and a pin guide attached to the frame by flexible members, wherein:
   a) one or more channels are defined through the pin guide perpendicular to a lower surface thereof and along a connection axis, the one or more channels having an entrance and an exit and said electrical connection pins being received therein;
   b) the base defines a plane for mounting the carrier to a surface that extends transverse to the connection axis;
   c) the flexible members of the carrier comprise a pair of arms that extend generally transverse to the connection axis in opposite directions from the frame towards the pin guide such that they hold the pin guide in a neutral position, and allow the pin guide to move parallel to the connection axis when the pin guide is pressed in a direction along the connection axis, independently of the electrical connection pins.

6. An electronic assembly, comprising a carrier and an electronic module, the electronic module having one or more electrical connection pins and being mounted to the carrier, the carrier having a frame, a base, and a pin guide attached to the frame by flexible members, wherein:
  a) one or more channels are defined through the pin guide perpendicular to a lower surface thereof and along a connection axis, the one or more channels having an entrance and an exit and said electrical connection pins being received therein;
  b) the base defines a plane for mounting the carrier to a surface that extends transverse to the connection axis;
  c) the flexible members hold the pin guide in a neutral position, and allow the pin guide to move parallel to the connection axis when the pin guide is pressed in a direction along the connection axis, independently of the electrical connection pins; and
  d) the electronic component is a planar display element with one or more connection pins extending from the element in a direction transverse to the plane of the element.

7. A circuit board assembly, comprising an electronic assembly and a circuit board with a socket mounted thereon, the electronic assembly being mounted to the circuit board, and the electronic assembly comprising a carrier and an electronic component having one or more connection pins, the electronic component being assembled to the carrier and the carrier comprising a frame for holding the component, a pin guide, and a flexible portion connection the pin guide to the frame, wherein:
  a) the pin guide has one or more channels therethrough that receive said electrical connection pins, the or each channel extending along a connection axis;
  b) the frame has a base for mounting the carrier to a surface that extends transverse to the connection axis;
  c) the flexible portion is adapted to flex to allow the pin guide to move parallel to the connection axis when the pin guide is pressed in a direction along the connection axis;
  d) the or each connection pin is electronically connected to a matching connection in the socket mounted on the circuit board; and
  e) the socket mounted on the circuit board has one or more pin receptacles, in which the shape of the pin guide matches the shape of the socket so that the or each pin is automatically aligned with a corresponding pin receptacle as the electronic assembly is mounted to the circuit board.

8. A circuit board assembly as claimed in claim 7, in which the socket protrudes from the circuit board, and the pin guide has a recess that matches the protrusion of the socket.

9. A circuit board assembly as claimed in claim 7 in which the carrier and circuit board have an alignment means by which the carrier is brought into approximate alignment with the circuit board as the electronic assembly is mounted to the circuit board.

10. A circuit board as claimed in claim 9, in which during mounting of the electronic assembly to the circuit board, the approximate alignment is made before the pin guide comes into contact with the socket.

* * * * *

UNITED STATES PATENT AND TRADEMARK OFFICE
CERTIFICATE OF CORRECTION

PATENT NO. : 6,932,637 B2 Page 1 of 1
DATED : August 23, 2005
INVENTOR(S) : Paul Simon Ewers et al.

It is certified that error appears in the above-identified patent and that said Letters Patent is hereby corrected as shown below:

Column 6,
Line 3, before "in the direction" delete "exist(s)" and substitute -- exit --.

Signed and Sealed this

Thirtieth Day of May, 2006

JON W. DUDAS
*Director of the United States Patent and Trademark Office*